(12) United States Patent
Rowley

(10) Patent No.: US 11,430,489 B2
(45) Date of Patent: *Aug. 30, 2022

(54) POWER MANAGEMENT COMPONENT FOR MEMORY SUB-SYSTEM POWER CYCLING

(71) Applicant: Micron Technology, Inc., Boise, ID (US)

(72) Inventor: Matthew D. Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

This patent is subject to a terminal disclaimer.

(21) Appl. No.: 17/016,544

(22) Filed: Sep. 10, 2020

(65) Prior Publication Data

US 2020/0411069 A1    Dec. 31, 2020

Related U.S. Application Data

(63) Continuation of application No. 16/112,442, filed on Aug. 24, 2018, now Pat. No. 10,803,909.

(51) Int. Cl.
| | | |
|---|---|---|
| *G06F 1/00* | (2006.01) | |
| *G11C 5/14* | (2006.01) | |
| *G06F 1/3296* | (2019.01) | |
| *G06F 1/28* | (2006.01) | |
| *G06F 1/3203* | (2019.01) | |
| *G06F 1/3215* | (2019.01) | |

(52) U.S. Cl.
CPC ............... *G11C 5/148* (2013.01); *G06F 1/28* (2013.01); *G06F 1/3296* (2013.01); *G06F 1/3203* (2013.01); *G06F 1/3215* (2013.01)

(58) Field of Classification Search
CPC .......... G11C 5/148; G06F 1/28; G06F 1/3296

USPC .......................................................... 713/323
See application file for complete search history.

(56) References Cited

U.S. PATENT DOCUMENTS 4,617,509 A * 10/1986 Tomisawa ............... G05F 1/577
    323/901
5,744,944 A *  4/1998 Danstrom ............... G05F 1/565
    323/284

(Continued)

FOREIGN PATENT DOCUMENTS

KR    1020170102215 A    9/2017

OTHER PUBLICATIONS

International Search Report and Written Opinion from related international aplpication No. PCT/US2019/042377, dated Nov. 13, 2019, 12 pages.

(Continued)

*Primary Examiner* — Volvick Derose
(74) *Attorney, Agent, or Firm* — Brooks, Cameron & Huebsch, PLLC

(57) ABSTRACT

A memory sub-system comprises a power management component comprising a plurality of regulators configured to output respective operating voltages for the memory sub-system. The power management component comprises a power management integrated circuit (PMIC) and is configured to monitor voltage levels of the plurality of regulators and prevent an event of the memory sub-system from occurring until the monitored voltage levels of a set of the plurality of regulators are determined to have reached respective threshold voltage levels.

18 Claims, 4 Drawing Sheets

(56) References Cited

U.S. PATENT DOCUMENTS

| | | | | |
|---|---|---|---|---|
| 5,804,955 A * | 9/1998 | Tuozzolo | ................. | G05F 1/56 323/277 |
| 6,188,210 B1 * | 2/2001 | Tichauer | ................. | G05F 1/468 323/273 |
| 8,607,036 B2 * | 12/2013 | More | ................. | G06F 1/26 713/1 |
| 2002/0087907 A1 * | 7/2002 | Poisner | ................. | G06F 1/206 713/340 |
| 2008/0024103 A1 * | 1/2008 | Komiya | ................. | H02M 3/1584 323/234 |
| 2008/0111526 A1 * | 5/2008 | Shuey | ................. | H02M 3/156 323/274 |
| 2008/0309393 A1 | 12/2008 | Sun et al. | | |
| 2008/0316779 A1 | 12/2008 | Jayaraman et al. | | |
| 2009/0085619 A1 | 4/2009 | Westwick et al. | | |
| 2011/0022859 A1 | 1/2011 | More et al. | | |
| 2012/0117397 A1 * | 5/2012 | Kolvick | ................. | G06F 1/3296 713/320 |
| 2012/0223687 A1 * | 9/2012 | Liu | ................. | G05F 1/56 323/271 |
| 2013/0003422 A1 * | 1/2013 | Persson | ................. | H02M 1/36 363/21.01 |
| 2013/0320942 A1 * | 12/2013 | Vemula | ................. | G05F 1/573 323/265 |
| 2014/0203866 A1 * | 7/2014 | Sinha | ................. | G05F 1/46 327/540 |
| 2014/0217999 A1 * | 8/2014 | Wibben | ................. | G05F 1/468 323/282 |
| 2015/0002160 A1 * | 1/2015 | Lee | ................. | G06F 1/3212 324/427 |
| 2015/0077076 A1 * | 3/2015 | Bhattad | ................. | G05F 1/56 323/280 |
| 2015/0145496 A1 * | 5/2015 | Louvel | ................. | H02M 3/33523 323/282 |
| 2015/0149796 A1 * | 5/2015 | Muljono | ................. | G06F 1/3296 713/320 |
| 2015/0177823 A1 | 6/2015 | Maiyuran et al. | | |
| 2015/0268678 A1 * | 9/2015 | Yu | ................. | G05F 1/46 327/540 |
| 2016/0189779 A1 * | 6/2016 | Guo | ................. | G11C 16/30 365/185.19 |
| 2017/0062056 A1 * | 3/2017 | Park | ................. | G11C 5/148 |
| 2017/0177057 A1 | 6/2017 | Morning-Smith et al. | | |
| 2017/0199536 A1 * | 7/2017 | Verma | ................. | G05F 1/575 |
| 2018/0128878 A1 * | 5/2018 | Menon | ................. | G01R 31/40 |
| 2019/0189182 A1 * | 6/2019 | Connolly | ................. | G11C 11/4074 |
| 2019/0229630 A1 * | 7/2019 | Halberstadt | ................. | H02M 1/088 |

OTHER PUBLICATIONS

Extended European Search Report from related European Patent Application No. 19851865.6, dated Apr. 14, 2022, 8 pages.

* cited by examiner

POWER MANAGEMENT COMPONENT FOR MEMORY SUB-SYSTEM POWER CYCLING

PRIORITY INFORMATION

This application is a Continuation of U.S. application Ser. No. 16/112,442, filed Aug. 24, 2018, the contents of which are incorporated herein by reference.

TECHNICAL FIELD

Embodiments of the disclosure relate generally to memory sub-systems, and more specifically, relate to a power management component for memory sub-system power cycling.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
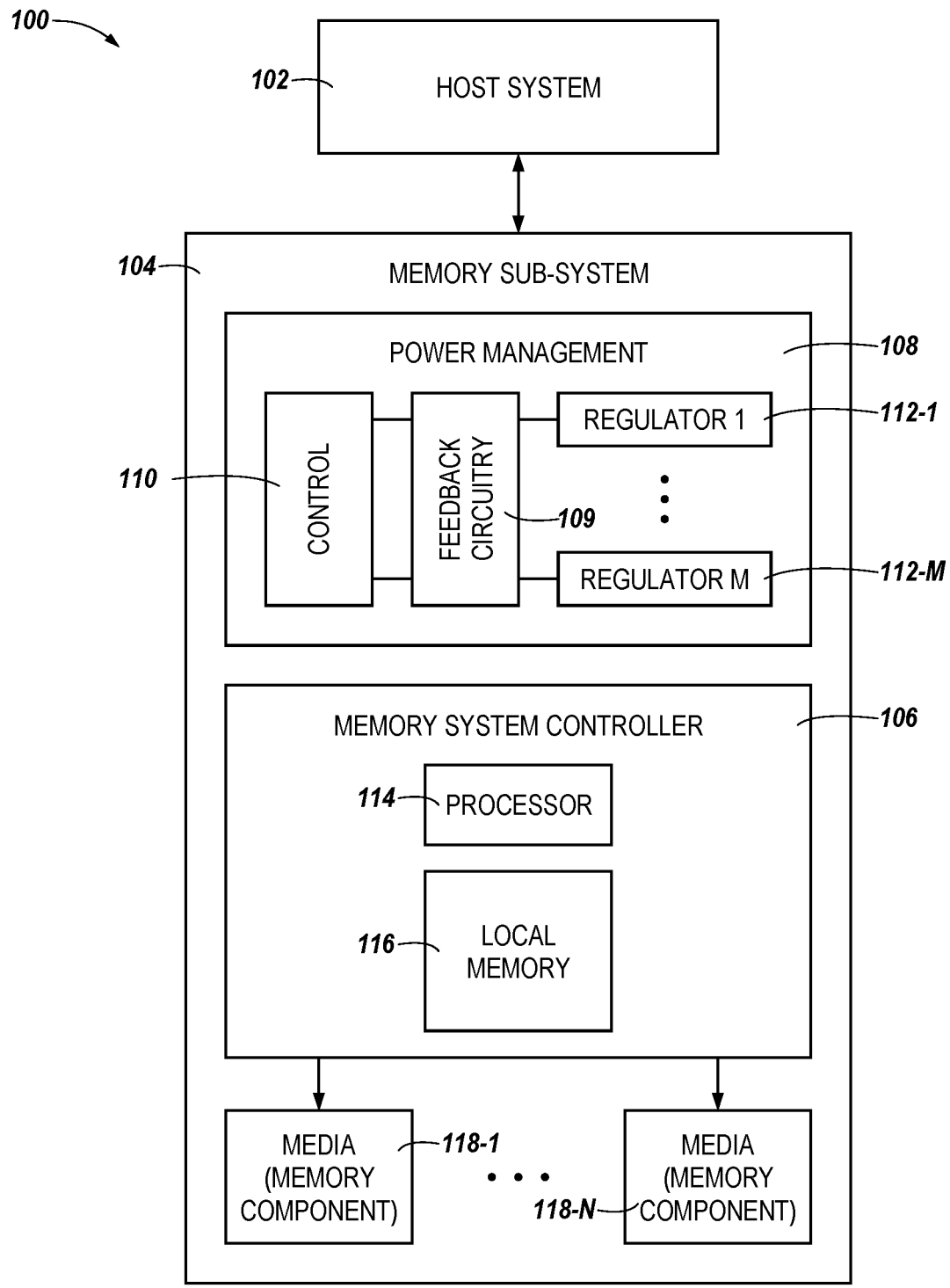
FIG. 1 illustrates an example computing environment that includes a memory sub-system in accordance with some embodiments of the present disclosure.

Aspects of the present disclosure are directed to a power management component for memory sub-system power cycling. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Memory sub-systems (e.g., SSDs) can include a power management component such as a power management integrated circuit (PMIC). A power management component can include various regulators providing output voltages to power various system components, such as control circuitry, input/output (I/O) circuitry, array core circuitry, peripheral components, etc. The regulators can include buck regulators, boost regulators, and/or low-dropout (LDO) regulators, among other regulator types. The regulator output voltages can correspond to various voltage rails for the memory sub-system, such as I/O rails, supply rails, reference rails, etc. As used herein, a voltage rail (or rail voltage) can be used to refer to an output voltage of a voltage regulator configured for a particular load. Some common voltage rails can include 1V, 2.5V, 3.3V, and 5V; however, embodiments of the present disclosure are not limited to particular rail voltage values.

In various instances, it can be beneficial to ensure that various memory sub-system voltage rails reach particular threshold voltage levels prior to certain memory sub-system events, such as prior to allowing a power management component of the memory sub-system to start/restart due to a memory sub-system power cycling event (e.g., reboot), for instance. For example, allowing a power management component of an SSD to restart prior to the rail voltages having been allowed to bleed to sufficiently low levels can have drawbacks such as damaging circuit components and/or enabling internal leakage paths, among other drawbacks. Some conventional memory sub-systems may wait a predetermined amount of time subsequent to system power loss (e.g., due to shutdown or otherwise) prior to allowing the power management component to restart in order to allow any floating voltage rails time to bleed. Some conventional memory sub-systems may use bleed resistors to assist with reducing voltage rail float, while some conventional memory sub-systems may check a dedicated pin (e.g., on the power management component) to determine whether a particular voltage rail has reached a sufficient bleed level. However, use of bleed resistors can be insufficient for ensuring that the voltage rails have reached sufficiently low levels prior to reboot, and adding dedicated pins can be very costly to implement and may increase memory sub-system printed circuit board area to an unacceptable size.

In contrast, aspects of the present disclosure address the above and other deficiencies by actively monitoring power management component output voltages corresponding to respective voltage rails within a memory sub-system, such as an SSD. The output voltages can be from respective regulators and can correspond to different voltage rails. In various embodiments, the regulator output voltage levels can be monitored by being fed back to a control component (e.g., sequencer) of the power management component. The control component can monitor the regulator voltages, determine when a set of the regulators voltages meets respective threshold voltage levels, and in response, allow a memory sub-system event to occur. For example, prior to allowing a memory sub-system reboot, the control component can confirm that all of the applicable voltage rails have reached their respective threshold voltage levels.

FIG. 1 illustrates an example computing environment 100 that includes a memory sub-system 104 in accordance with some embodiments of the present disclosure. The host system 102 can be a computing device such as a desktop computer, laptop computer, network server, mobile device, or such computing device that includes a memory and a processing device. The host system 102 can include or be coupled to the memory sub-system 104 so that the host system 102 can read data from or write data to the memory sub-system 104. The host system 102 can be coupled to the memory sub-system 104 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 102 and the memory sub-system 104. The host system 102 can further utilize an NVM Express (NVMe) interface to access the memory components 118-1 to 118-N when the memory sub-system 104 is coupled with the host system 102 by the PCIe interface. The physical host interface can provide an interface for passing control, address, data, and other signals between the memory sub-system 104 and the host system 102.

The memory sub-system 104 can include media, such as memory components 118-1 to 118-N. The memory components 118-1 to 118-N can be volatile memory components, non-volatile memory components, or a combination of such. In some embodiments, the memory sub-system 104 is a storage system. An example of a storage system is a SSD. In some embodiments, the memory sub-system 104 is a hybrid memory/storage sub-system. In general, the computing environment 100 can include a host system 102 that uses the memory sub-system 104. For example, the host system 102 can write data to the memory sub-system 104 and read data from the memory sub-system 104.

The memory components 118-1 to 118-N can include various combinations of the different types of non-volatile memory components and/or volatile memory components. An example of non-volatile memory components includes a negative-and (NAND) type flash memory. Each of the memory components 118-1 to 118-N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 118-1 to 118-N can be based on various memory technologies and/or array architectures. In some embodiments, the memory components 118-1 to 118-N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and which can be arranged as a planar array, a cross-point array, three-dimensional cross-point array, etc.

The memory system controller 106 can communicate with the memory components 118-1 to 118-N to perform operations such as reading data, writing data, or erasing data at the memory components 118-1 to 118-N and other such operations. The memory system controller 106 can include hardware such as one or more integrated circuits and/or discrete components, a buffer memory, or a combination thereof. The memory system controller 106 can be a microcontroller, special purpose logic circuitry (e.g., a field programmable gate array (FPGA), an application specific integrated circuit (ASIC), etc.), or other suitable processor. The memory system controller 106 can include a processing device (e.g., processor 114) configured to execute instructions stored in local memory 116. The local memory 116 of the memory system controller 106 includes an embedded memory configured to store instructions for performing various processes, operations, logic flows, and routines that control operation of the memory sub-system 104, including handling communications between the memory sub-system 104 and the host system 102. In some embodiments, the local memory 116 can include memory registers storing memory pointers, fetched data, etc. The local memory 116 can also include read-only memory (ROM) for storing micro-code.

While the example memory sub-system 104 in FIG. 1 has been illustrated as including the memory system controller 106, in another embodiment of the present disclosure, a memory sub-system 104 may not include a memory system controller 106, and may instead rely upon external control (e.g., provided by an external host, or by a processor or controller separate from the memory sub-system).

In general, the memory system controller 106 can receive commands or operations from the host system 102 and can convert the commands or operations into instructions or appropriate commands to achieve the desired access to the memory components 118-1 to 118-N. The memory system controller 106 can be responsible for other operations such as wear leveling operations, garbage collection operations, error detection and error-correcting code (ECC) operations, encryption operations, caching operations, and address translations between a logical block address and a physical block address that are associated with the memory components 118-1 to 118-N. The memory system controller 106 can further include host interface circuitry to communicate with the host system 102 via a physical host interface (not shown). The host interface circuitry can convert the commands received from the host system into command instructions to access the memory components 118-1 to 118-N as well as convert responses associated with the memory components 118-1 to 118-N into information for the host system 102.

The memory sub-system 104 can also include additional circuitry or components that are not illustrated. For instance, the memory components 118-1 to 118-N can include control circuitry, address circuitry (e.g., row and column decode circuitry), and/or input/output (I/O) circuitry by which they can communicate with memory system controller 106 and/or host system 102. As an example, in some embodiments, the address circuitry (can receive an address from the memory system controller 106 and decode the address to access the memory components 118-1 to 118-N.

In some embodiments, the memory sub-system 104 can receive an event signal (e.g., a restart signal), for example, from the host system 102. An event signal requests the memory sub-system 104 to perform one or more operations to initiate the event (e.g., restart). For example, the event signal may be a restart signal that requests the memory sub-system 104 to perform one or more operations to restart the memory sub-system 104. Responsive to receipt of the event signal (e.g., restart signal), some components of the memory sub-system 104, such as the power management component 108, can be configured to determine, prior to performing the operation(s) for the event (e.g., restart), whether event requirements are met to avoid any undesirable issues that can result from the event occurring without meeting the event requirements. The event requirements can specify threshold voltage levels to be met by each component of the memory sub-system 104 and/or the power management component 108 prior to allowing the occurrence of the event. Embodiments of the present disclosure are not limited to event signals associated with restart of a memory subsystem 104. For example, the event signals can correspond to other events, which can include power cycling events (e.g., shutting down and/or restarting) of various other components of computing environment 100 and/or events associated with status changes of the system and/or components thereof.

The power management component 108 can change operation states. Example states can include, and are not limited to, an active state and a reduced power state. The active state can be entered responsive to a restart signal received at the power management component 108 from the host system 102. A reduced power state can include a sleep state, a standby state, and/or an off state, among other types of operation states, in which the power management component 108 of the memory sub-system 104 is configured to output lower voltages than those associated with operation of an active state. An event can change the operation state of the power management component 108. For example, the restart of the memory sub-system 104 can include changing the memory sub-system 104 from a reduced power state into an active state.

The memory sub-system 104 includes a power management component 108. In some embodiments, the power management component 108 and/or functionality of the power management component 108 is part of the host system 102, an application, or an operating system.

The power management component 108 can further include a control component 110, feedback circuitry 109, and regulators 112-1 to 112-M. The voltage levels of the regulators 112-1 to 112-M can be monitored by the control component 110. In various embodiments, the power management component 108 can include a power management integrated circuit (PMIC) (not shown in FIG. 1) within which the control component 110 can be integrated. As described below in connection with FIG. 2, in some embodiments, a portion of the regulators 112-1 to 112-M can be located internal to the PMIC of the power management component 108 while another portion of the regulators 112-1 to 112-M can be located external to the PMIC of the power management component 108. However, embodiments are not so limited. For example, all of the regulators 112-1 to 112-M can be located internal to the PMIC or external to the PMIC.

The memory sub-system 104 can operate in various modes such as power up/down, operation, sleep, standby, etc. The monitored threshold voltage levels of the regulators can be programmable (e.g., by the controller) based on the different modes.

The control component 110, which can include hardware in combination with software and/or firmware, can be configured to monitor the voltage levels of the regulators 112-1 to 112-M by comparing output voltages of the regulators 112-1 to 112-M with respective threshold voltages. A threshold voltage level can be representative of a voltage level that is sufficiently low (or high) so as to avoid adverse effects to memory sub-system components to which the output voltages are provided (e.g., due to residual voltage) responsive to the occurrence of the event (e.g., restart) of a memory sub-system, for instance.

The control component 110 can be further configured to adjust the output voltages of the regulators 112-1 to 112-M based on operation state change of the power management component 108. For example, responsive to a restart of the memory sub-system 104 that puts the power management component 108 in the restart state (e.g., an active state) from the reduced power state, the control component 110 can adjust output voltages of the regulators 112-1 to 112-M to respective voltage levels corresponding to the restart state.

In some embodiments, the regulators 112-1 to 112-M can be configured to provide output voltages (e.g., operating voltages) to various components of the memory sub-system 104. As described herein, the output voltages can correspond to various voltage rails of the memory sub-system, such as I/O rails, supply rails, reference rails, etc. that are provided to power various system components, such as control circuitry, input/output (I/O) circuitry, array core circuitry, peripheral components, etc. For example, the output voltages of the regulators 112-1 to 112-M can correspond to respective supply voltage rails used in the SSD.

The feedback circuitry 109 can be coupled to the regulators 112-1 to 112-M and to the control component 110. In some embodiments, the feedback circuitry 109 can be configured to receive output voltages of the regulators 112-1 to 112-M as respective inputs and provide feedback signals to the control component 110. The feedback signals can indicate whether the respective output voltages have reached particular threshold voltage levels. As further described in connection with FIG. 2, the feedback circuitry 109 can include comparators configured to provide respective feedback signals to the control component 110 based on comparisons of the corresponding respective regulators output voltages to respective reference voltages.

The power management component 108 can be configured, using the control component 110, to monitor the respective feedback signals, and control adjustment of the output voltages of the regulators 112-1 to 112-M based on an operation state change of the power management component 108 and/or an occurrence of an event such as a restart of the memory sub-system 104. For example, when the power management component 108 determines, based on the respective feedback signals, that the reboot requirements are met (e.g., that the monitored voltages have all reached respective threshold voltage levels), the power management component 108 can allow the restart of the memory sub-system 104 and/or adjust output voltages corresponding to a number of regulators 112-1 to 112-M to voltage levels corresponding to a restart state (e.g., active state). Stated alternatively, the power management component 108 can prevent the restart of the memory sub-system 104 and/or delay adjusting the output voltages to voltage levels corresponding to the restart state, for example, when the power management component 108 determines that the reboot requirements are not met (e.g., that one or more monitored voltages have not reached a threshold voltage level). As used herein, a reboot requirement can be used to refer to a requirement that needs to be met prior to reboot a memory sub-system such as the memory sub-system 104. Further details regarding operation of the power management component 108 are described below.

Figure 2:
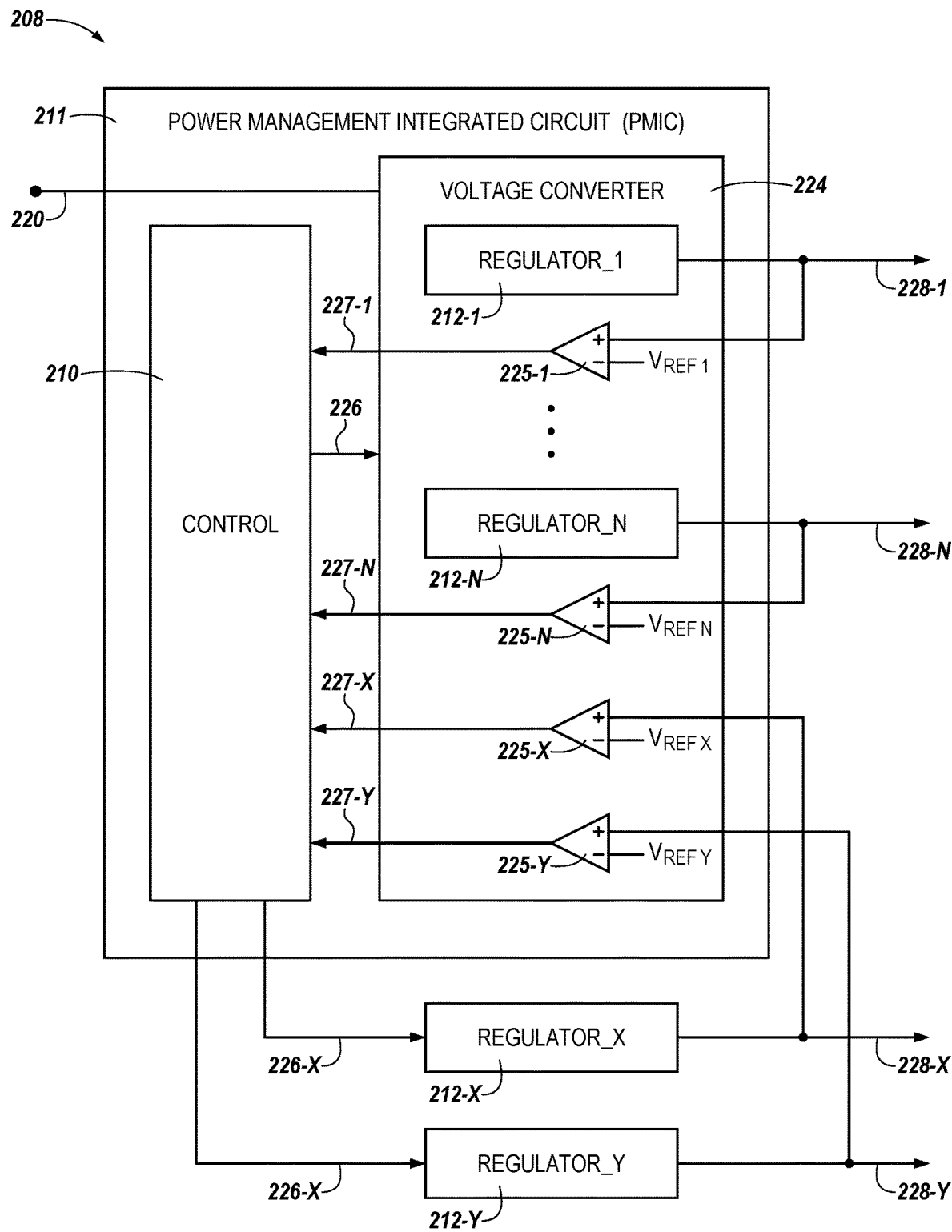
FIG. 2 illustrates an example of a power management component in accordance with some embodiments of the present disclosure.

FIG. 2 illustrates an example of a power management component 208 in accordance with some embodiments of the present disclosure. The power management component 208 can include a PMIC 211 and regulators 212-X to 212-Y. The PMIC 211 can include a control component 210 and voltage converter 224. The voltage converter 224 can include regulators 212-1 to 212-N, and feedback circuitry illustrated, for example, as comparators 225-1 to 225-N and comparators 225-X and 225-Y. Regulators 212-1 to 212-N can be located internal to the PMIC 211 and regulators 212-X to 212-Y can be located external to the PMIC 211, as shown in FIG. 2. In some embodiments, the external regulators 212-X to 212-Y can be coupled to the PMIC 211 via respective general-purpose input output (GPIO) pins and/or lines. The internal regulators 212-1 to 212-N and the external regulators 212-X to 212-Y can be collectively referred to as regulators 212.

The PMIC 211 and/or the external regulators 212-X to 212-Y can be powered by an input voltage 220 (e.g., $V_{DD}$), which can be a main power supply provided by a host, for example. The input voltage 220 can be generated by the memory sub-system (e.g., memory sub-system 104 illustrated in FIG. 1) or by electronic devices coupled thereto.

The PMIC 211, via voltage converter 224, can convert the received input voltage 220 into multiple output voltages 228-1 to 228-N using regulators 212-1 to 212-N. The PMIC 211, via voltage converter 224, can convert the received input voltage 220 into multiple output voltages 228-X to 228-Y using regulators 212-X to 212-Y. The output voltages 228-1 to 228-N and output voltages 228-X to 228-Y can be collectively referred to as output voltages 228.

The regulators 212 can be configured to generate respective output voltages 228, which can be provided to a respective component of the memory sub-system such as the memory system controller 106, the processor 114, the local memory 116, and the memory components 118-1 to 118-N and/or various circuitry associated therewith (e.g., I/O circuitry, address circuitry, control circuitry, etc.). The regulators 212 can include a low-dropout (LDO) regulator, a buck-boost converter, a buck regulator, a boost regulator, or combination thereof, although embodiments are not so limited.

As an example, an LDO regulator can be a linear voltage regulator that operates with a very small input-output differential voltage that can regulate an output voltage of the buck-boost converter to output one of the output voltages 228. Multiple LDO regulators can be provided based on the output voltages 228 that are used in the memory sub-system.

A buck-boost converter can detect the input voltage 220 and can operate in a buck-mode when the input voltage 220 is higher than an output voltage from the buck-boost converter. The buck-boost converter can operate in a boost-mode when the detected input voltage 220 is lower than an output voltage from the buck-boost converter. The buck-boost converter can contribute to output of a constant voltage.

A buck regulator can be a voltage reduction-type direct current (DC)/DC converter that can generate a predetermined output voltage by reducing the input voltage 220. The buck regulator can use a switching device that is turned on/off in a certain period and can have a structure in which an input power supply (e.g., the input voltage 220) is connected to a circuit while the switch is turned on and is not connected to the circuit while the switch is turned off. The buck regulator can output a DC voltage by averaging, through an inductor-capacitor (LC) filter, a voltage having a pulse shape that is periodically connected to or disconnected from a circuit in this manner. The buck regulator can use a principle of generating an output voltage by averaging a pulse voltage by periodically chopping a DC voltage such that the output voltage of the buck regulator can have a voltage that is less than an input voltage 220 of the buck regulator.

A boost regulator can be a voltage boost-type DC/DC converter. In the boost regulator, when a switch is turned on, the input voltage 220 can be connected to two terminals of an inductor to form a charge current. When the switch is turned off, the charge current can be transferred to a load. Accordingly, the amount of current of an output terminal of the boost regulator can be less than that of an input terminal of the boost regulator. Since there is no loss due to an operation principle of the boost regulator, an output voltage of the boost regulator can be higher than an input voltage 220 of the boost regulator, based on an "input current*input voltage=output current*output voltage" relationship.

The regulators 212 can be coupled to bleed resistors. The bleed resistors can be coupled (e.g., in parallel) to a load to which the regulator output voltages are provided. The bleed resistors can be used to discharge (e.g., bleed) voltage on conductive lines between the regulators 212 and the components (e.g., loads) to which their respective outputs are provided. Although not shown in FIG. 2, in some embodiments, the regulators 212 can be further coupled to output filter circuitry in addition to their respective loads. Accordingly, the output voltages 228 may be a filtered signal whose voltage is filtered with a respective output filter circuitry.

The control component 210 can be configured to monitor voltage levels of the regulators 212 based on signals provided by the comparators. In some embodiments, the monitored voltage levels can be used in various ways. For example, the monitored voltage levels can be used to control output voltages 228. In another example, the monitored voltage levels can be used to control an occurrence of an event (e.g., restart) of the memory sub-system based on a comparison between the monitored voltage levels and respective threshold voltage levels. The respective threshold voltage levels can be reference voltages (e.g., $V_{REF1}$ to $V_{REFN}$) of the comparators 225-1 to 225-N and/or reference voltages (e.g., $V_{REFX}$ to $V_{REFY}$) of the comparators 225-X to 225-Y. As described herein, a threshold voltage level can be representative of a voltage level that is sufficiently low so as to avoid adverse effects to memory sub-system components to which the output voltages are provided (e.g., due to residual voltage) responsive to the occurrence of the event (e.g., restart) of a memory sub-system, for instance. The comparators 225-1 to 225-N that are coupled to the internal regulators 212-1 to 212-N and the comparators 225-X to 225-Y that are coupled to the external regulators 212-X to 212-Y can be collectively referred to as comparators 225.

The comparators 225 can be configured to receive an output voltage (e.g., one of the output voltages 228) from a respective one of the regulators 212 and compare the received output voltage with a respective one of the reference voltages $V_{REF1}$ to $V_{REFN}$ and/or $V_{REFX}$ to $V_{REFY}$. For example, the comparator 225-1 can receive the output voltage 228-1 from the regulator 212-1 and compare the output voltage 228-1 with the reference voltage $V_{REF1}$. The comparison includes determining whether the received output voltage has reached a respective reference voltage.

In some embodiments, at least two of the comparators 225 can have different respective reference voltages associated therewith. For example, a voltage level of the reference voltage $V_{REF1}$ can be different than a voltage level of the reference voltage $V_{REFN}$. As such, at least some of the output voltages 228-1 to 228-N can be compared to different threshold voltage levels.

A result of the comparison can be provided to the control component 210 in the form of a signal (e.g., signals 227-1 to 227-N and/or signals 227-X to 227-Y). The signals 227-1 to 227-N and/or 227-X to 227-Y that can be provided by the comparators 225 can be binary in nature and can indicate whether a respective monitored output voltage has reached a threshold voltage level. For example, the signals can represent binary logic values (e.g., a logical "1" or "0") with one binary value indicating that an output voltage has reached a reference voltage and the other binary value indicating that an output voltage has not yet reached a reference voltage.

In some embodiments, the control component 210 can be configured to determine whether to adjust or delay adjusting the output voltages 228 based on the comparison. For example, the control component 210 can be configured to increase the output voltages 228 when respective signals 227-1 to 227-N and/or 227-X to 227-Y indicate that output voltages of a set of the regulators 212 have reached the respective reference voltage levels. In another example, the control component 210 can be configured to delay increasing the output voltages 228 when the respective signals 227-1 to 227-N and/or 227-X to 227-Y indicate that output voltages of the set of the regulators 212 have not yet reached the respective reference voltage levels. The set of the regulators 212 may be a portion and/or all of the regulators 212. As shown in FIG. 2, the control component 210 can control the external regulators 212-X to 212-Y via respective control signals 226-X to 226-Y.

In some embodiments, the control component 210 can be configured to determine whether to allow or prevent an event (e.g., restart) of the memory sub-system based on the comparison. For example, the control component 210 can be configured to allow a restart of the memory sub-system when respective signals 227-1 to 227-N and/or 227-X to 227-Y indicate that the output voltages 228 are determined to have reached respective reference voltage levels. In another example, the control component 210 can be configured to prevent the restart of memory sub-system when respective signals 227-1 to 227-N and/or 227-X to 227-Y indicate that at least one of the output voltages 228 has not reached the respective reference voltage level.

In some embodiments, the control component 210 can be configured to allow a change in an operation state of the power management component 208 based on the signals provided by the comparators 225. For example, when one or more of the received signals 227-1 to 227-N and/or 227-X to 227-Y indicates that an output voltage has not yet reached a respective reference voltage, the control component 210 can prevent the restart of the memory sub-system. The memory sub-system can be prevented from being restarted until a set of the received signals 227-1 to 227-N and/or 227-X and 227-Y indicate that the output voltages 228 have reached respective reference voltages $V_{REF1}$ to $V_{REFN}$ and/or $V_{REFX}$ to $V_{REFY}$. Stated alternatively, when the received signals 227-1 to 227-N and/or 227-X to 227-Y indicate that the output voltages 228 have reached respective reference voltages $V_{REF1}$ to $V_{REFN}$ and/or $V_{REFX}$ to $V_{REFY}$, the control component 210 can allow the restart of the memory sub-system. The set of the received signals 227-1 to 227-N and/or 227-X and 227-Y can include all of the received signals 227-1 to 227-N and 227-X and 227-Y. For example, the memory sub-system can be prevented from being restarted until all of the received signals 227-1 to 227-N and/or 227-X and 227-Y indicate accordingly.

In some embodiments, the monitored output voltage levels can be programmable values. For example, control component 210 can be configured to program respective reference voltages of the regulators 212. In some embodiments, the reference voltages can be programmed to different values depending on operation states of the power management component 208. For example, a particular reference voltage can be programmed, when the power management component 208 is placed in an active state, to be lower than when the power management component 208 is in a reduced power state.

Figure 3:
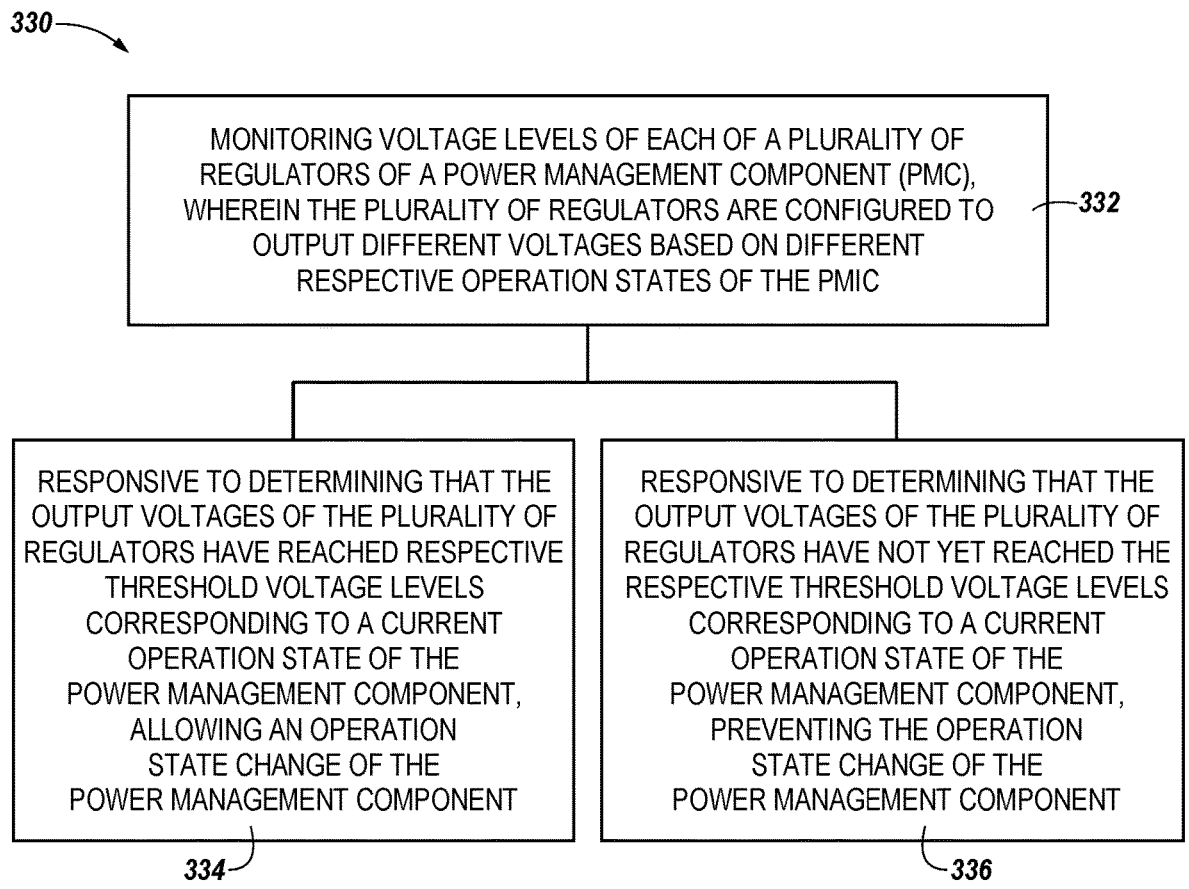
FIG. 3 is a flow diagram of an example method for monitoring voltage levels of a memory sub-system in accordance with some embodiments of the present disclosure.

FIG. 3 is a flow diagram of an example method 330 for monitoring voltage levels of a memory sub-system in accordance with some embodiments of the present disclosure. The method 330 can be performed by processing logic that can include hardware (e.g., processing device, circuitry, dedicated logic, programmable logic, microcode, integrated circuit, etc.) software (e.g., instructions executed by a processing device), or a combination of thereof. In some embodiments, the method 330 can be performed by a power management component such as the power management component 108 of FIG. 1 or 208 of FIG. 2. Although shown in a particular sequence or order, unless otherwise specified, the order of the processes of the method 330 can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 332, the power management component monitors voltage levels of one or more regulators coupled to the power management component. At least some of the regulators can be configured to output different voltages based on different respective operation states of the power management component, as described in connection with FIG. 1. The power management component can independently monitor bleed voltage levels of respective voltage rails of a memory sub-system using feedback circuitry provided to a control component. The memory sub-system, power management component, the regulators, the feedback circuitry, and the control component can be respectively analogous to the memory sub-system 104, power management component 108, regulators 112-1 to 112-M, feedback circuitry 109, and control component 110 illustrated in FIG. 1, herein.

In some embodiments, the threshold voltage levels can be programmable by using the control component. For example, the control component can set the respective threshold voltage levels for the different respective operation states based on predetermined and/or user-defined values.

At block 334, the power management component allows an operation state change of the power management component responsive to determining that one or more of the output voltages of the regulators have reached respective threshold voltage levels corresponding to the current operation state. As described herein, the power management component can be put into one of an active state and a reduced power state. The reduced power state can include a sleep state, a standby state, and/or an off state, among other states. For example, when the current operation state is a sleep state, allowing the operation state change of the power management component can include allowing the power management component to exit the sleep state.

At block 336, the power management component prevents the operation state change of the power management component responsive to determining that one or more of the output voltages of the regulators have not yet reached the respective threshold voltage levels corresponding to the current operation state. When the current operation state is a reduced power state, the operation state change can be a change from the reduced power state to an active state. Accordingly, the power management component can prevent the regulators from outputting the increased voltages corresponding to the active state responsive to determining that the output voltages of the regulators have not yet reached the respective threshold levels corresponding to the reduced power state.

Figure 4:
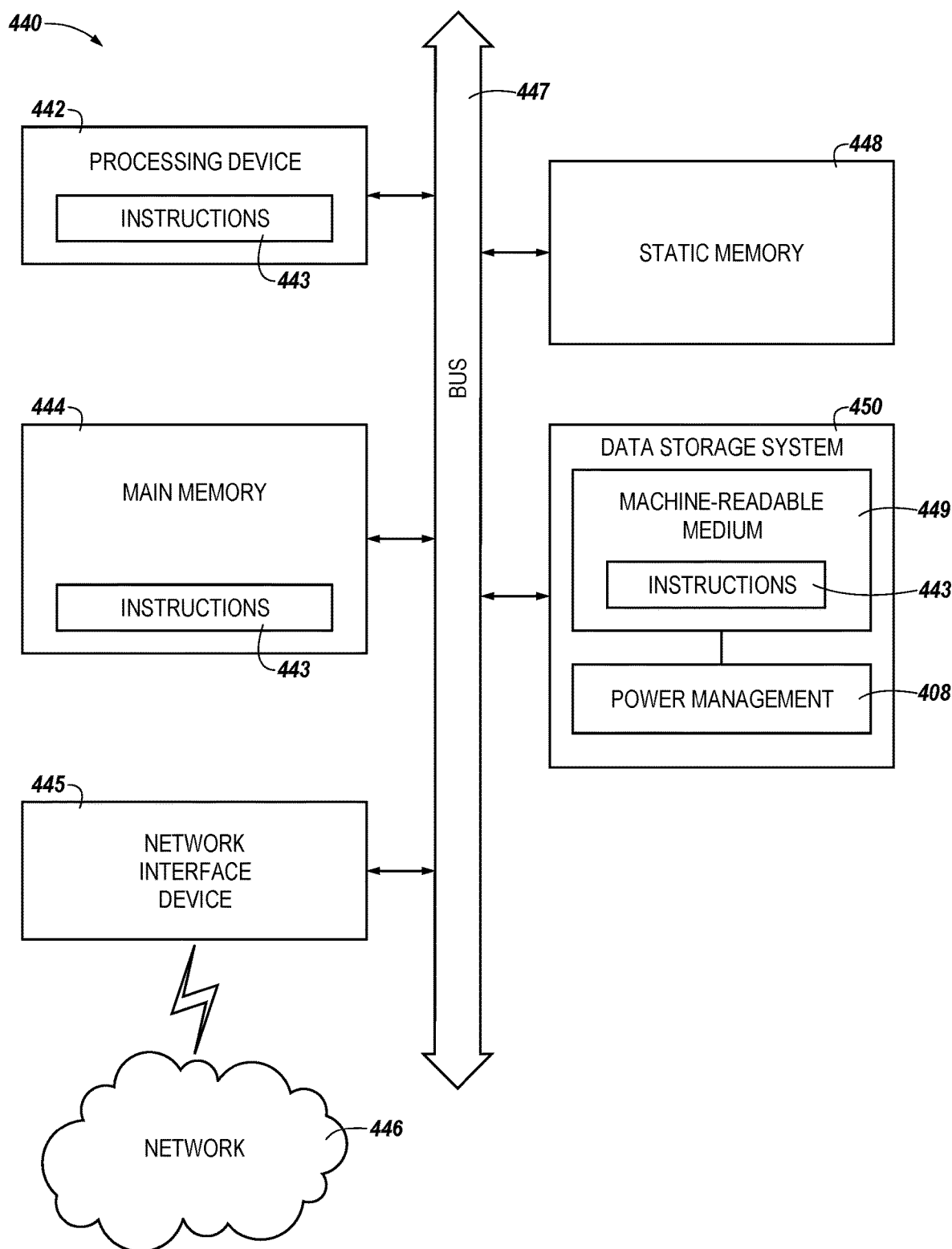
FIG. 4 is a block diagram of an example computer system in which embodiments of the present disclosure can operate.

FIG. 4 illustrates an example machine of a computer system 440 within which a set of instructions, for causing the machine to perform any one or more of the methodologies discussed herein, can be executed. In some embodiments, the computer system 440 can correspond to a host system (e.g., the host system 102 of FIG. 1) that includes, is coupled to, and/or utilizes a memory sub-system (e.g., the memory sub-system 104 of FIG. 1). The computer system 440 can be used to execute operations of a memory system controller 106 and/or processor 114 on an operating system to perform operations corresponding to the power management component 108 of FIG. 1. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 440 includes a processing device 442, a main memory 444, a static memory 448, and a data storage system 450, which communicate with each other via a bus 447. In some embodiments, the main memory 444 can be read-only memory (ROM), flash memory, dynamic random access memory (DRAM), such as synchronous DRAM (SDRAM) or Rambus DRAM (RDRAM), among other possibilities. In some embodiments, the static memory 448 can be flash memory, static random access memory (SRAM), among other possibilities. The data storage system 450 can correspond to the memory sub-system 104 of FIG. 1.

Processing device 442 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 442 can also be one or more special-purpose processing devices such as an application specific integrated circuit (ASIC), a field programmable gate array (FPGA), a digital signal processor (DSP), network processor, or the like. The processing device 442 is configured to execute instructions 443 for performing the operations discussed herein. The computer system 440 can further include a network interface device 445 to communicate over a network 446.

The data storage system 450 can include a machine-readable storage medium 449 (also known as a computer-readable medium) on which is stored one or more sets of instructions 443 or software embodying any one or more of the methodologies or functions described herein. The instructions 443 also can reside, completely or at least partially, within the main memory 444 and/or within the processing device 442 during execution thereof by the computer system 440. The main memory 444 and the processing device 442 also contribute to the machine-readable storage media. The machine-readable storage medium 449, data storage system 450, and/or main memory 444 can correspond to the memory sub-system 104 of FIG. 1.

In some embodiments, the instructions 443 can include instructions to implement functionalities corresponding to a power management component. The functionalities can, for example, correspond to the functionalities of the power management component 108 or 208 of FIG. 1 and FIG. 2, respectively, among others. While the machine-readable storage medium 449 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that can cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data values (bits) within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description herein. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable storage medium, such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
a power management component comprising a plurality of regulators configured to output respective operating voltages for the memory sub-system, wherein the power management component comprises a power management integrated circuit (PMIC);
the power management component configured to, in response to receipt of an event signal:
monitor voltage levels of the plurality of regulators;
determine that the monitored voltage levels of a set of the plurality of regulators have not reached respective threshold voltage levels;
prevent, in order to prevent an event of the memory sub-system associated with the event signal from occurring, the plurality of regulators from outputting increased voltage levels until the monitored voltage levels of the set of the plurality of regulators are determined to have reached the respective threshold voltage levels; and
allow the plurality of regulators to output increased voltage levels responsive to determining that the monitored voltage levels of the set have reached the respective threshold voltage levels.

2. The memory sub-system of claim 1, wherein the power management component is configured to allow the event to occur responsive to a determination that the set of the monitored voltage levels of the plurality of regulators are determined to have reached the respective threshold voltage levels.

3. The memory sub-system of claim 1, wherein the threshold voltage levels corresponding to the monitored voltage levels of the set of the plurality of regulators comprise at least two different respective threshold voltage levels.

4. The memory sub-system of claim 1, wherein the event of the memory sub-system is a restart of the memory sub-system.

5. The memory sub-system of claim 1, wherein the power management component comprises a control component configured to monitor the voltage levels of the plurality of regulators by comparing output voltages of the plurality of regulators to the respective threshold voltages.

6. The memory sub-system of claim 1, wherein the set of the plurality of regulators comprises all of the plurality of regulators.

7. A power management component, comprising:
feedback circuitry coupled to a plurality of regulators and to a control component; and
wherein the feedback circuitry is configured to:
receive output voltages of the plurality of regulators as respective inputs; and
provide feedback signals to the control component, wherein the feedback signals indicate whether the respective output voltages have reached respective threshold voltage levels corresponding to an operation state; and
wherein the control component is configured to:
monitor the respective feedback signals;
determine, based on the respective feedback signals, that the respective output voltages have reached the respective threshold voltage levels corresponding to the operation state; and
allow the plurality of regulators to increase voltage levels of the output voltages responsive to the determination;
wherein the operation state is a reduced power state, and wherein the control component is configured to:
place a number of the plurality of regulators in the reduced power state; and
delay allowing the plurality of regulators to increase voltage levels of the output voltages corresponding to a different operation state until determining that the respective output voltages have reached the respective threshold voltage levels corresponding to the reduced power state.

8. The power management component of claim 7, wherein the feedback circuitry comprises comparators configured to provide respective feedback signals to the control component based on comparisons of the corresponding respective regulator output voltages to respective reference voltages.

9. The power management component of claim 7, wherein the respective threshold voltage levels corresponding to the operation state are programmable values that are adjustable based on the operation state.

10. The power management component of claim 7, wherein:
the reduced power state is one of a sleep state, a standby state, and an off state; and
the different operation state is an active state.

11. The power management component of claim 10, wherein the active state is a restart state responsive to a restart signal received at the power management component from a host.

12. The power management component of claim 7, wherein the output voltages of the plurality of regulators correspond to respective supply voltage rails used in a solid state drive.

13. The power management component of claim 7, wherein the plurality of regulators comprises a low-dropout (LDO) regulator, a buck-boost converter, a buck regulator, a boost regulator, or combinations thereof.

14. A method, comprising:
monitoring voltage levels of each of a plurality of regulators coupled to a power management integrated circuit (PMIC), wherein the plurality of regulators is configured to output different voltages based on different respective operation states of the PMIC; and
based on a current operation state of the PMIC:

responsive to determining that the output voltages of the plurality of regulators have reached respective threshold voltage levels corresponding to the current operation state, allowing an operation state change of the PMIC by allowing the plurality of regulators to output increased voltages; and responsive to determining that the output voltages of the plurality of regulators have not yet reached the respective threshold voltage levels corresponding to the current operation state, preventing the operation state change of the PMIC.

15. The method of claim 14, wherein the current operation state is a reduced power state, wherein the operation state change is a change from the reduced power state to an active state, and wherein the method comprises:

responsive to determining that the output voltages of the plurality of regulators have reached respective threshold voltage levels corresponding to the reduced power state, allowing the plurality of regulators to output increased voltages corresponding to the active state; and responsive to determining that the output voltages of the plurality of regulators have not yet reached the respective threshold voltage levels corresponding to the reduced power state, preventing the plurality of regulators from outputting the increased voltages corresponding to the active state.

16. The method of claim 14, wherein monitoring voltage levels of each of the plurality of regulators coupled to the PMIC comprises independently monitoring bleed voltage levels of each of a respective plurality of voltage rails of a memory sub-system using feedback circuitry provided to a control component.

17. The method of claim 16, wherein the method comprises setting the respective threshold voltage levels for the different respective operation states using the control component.

18. The method of claim 16, wherein the current state is a sleep state, and wherein allowing the operation state change of the PMIC comprises allowing the PMIC to exit the sleep state.

* * * * *